US012375040B2

(12) United States Patent
Khlat (10) Patent No.: US 12,375,040 B2
(45) Date of Patent: Jul. 29, 2025

(54) VIRTUAL RADIO FREQUENCY (VRF) EQUALIZER FOR ENVELOPE TRACKING INTEGRATED CIRCUIT (ETIC)

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 700 days.

(21) Appl. No.: 17/654,444

(22) Filed: Mar. 11, 2022

(65) Prior Publication Data

US 2023/0246594 A1 Aug. 3, 2023

Related U.S. Application Data

(60) Provisional application No. 63/304,776, filed on Jan. 31, 2022.

(51) Int. Cl.
*H03F 3/04* (2006.01)
*H03F 1/02* (2006.01)
*H03F 3/45* (2006.01)

(52) U.S. Cl.
CPC ....... *H03F 1/0233* (2013.01); *H03F 3/45475* (2013.01); *H03F 1/0211* (2013.01); *H03F 1/0244* (2013.01); *H03F 2200/105* (2013.01)

(58) Field of Classification Search
CPC .............. H03F 1/0233; H03F 3/45475; H03F 2200/105; H03F 1/0288; H03F 1/0216; H03F 3/19; H03F 3/245; H03F 1/0222; H03F 3/211; H03F 3/24; H03F 3/04; H03F 1/0244; H03F 1/0211; H03F 2200/504; H03F 1/0227; H04L 25/03878; H03G 3/3042; H03G 3/004; H03G 3/3047; H03G 3/3036
See application file for complete search history.

(56) References Cited

U.S. PATENT DOCUMENTS 7,471,155 B1 * 12/2008 Levesque ................. H03F 1/30
                                                           330/296
9,166,538 B2 * 10/2015 Hong ....................... H03F 3/191
9,225,231 B2 * 12/2015 Gorisse ................. H03F 1/0211
9,276,475 B2 *  3/2016 Barth ..................... H02M 5/293
(Continued)

OTHER PUBLICATIONS

Choi, J. et al., "Optimized Envelope Tracking Operation of Doherty Power Amplifier for High Efficiency Over an Extended Dynamic Range," IEEE Transactions on Microwave Theory and Techniques, vol. 57, No. 6, Jun. 2009, IEEE, pp. 1508-1515.
(Continued)

*Primary Examiner* — Khanh V Nguyen
(74) *Attorney, Agent, or Firm* — Withrow & Terranova, P.L.L.C.

(57) ABSTRACT

A virtual radio frequency (VRF) equalizer for an envelope tracking integrated circuit (ETIC) is disclosed. In one aspect, an ETIC provides envelope tracking (ET) for a barely Doherty (BD) power amplifier stage. The VRF equalizer includes circuitry that provides ripple cancelation that is caused by load modulation of the BD power amplifier stage. Additional circuitry is included to compensate for an amplifier within the ETIC. By canceling the ripple within the ETIC, the overall performance and efficiency of the BD power amplifier stage is improved, resulting in better performance of a transmitter in a wireless communication device.

17 Claims, 7 Drawing Sheets

(56) References Cited

U.S. PATENT DOCUMENTS

| | | | |
|---|---|---|---|
| 9,298,198 B2* | 3/2016 | Kay | H03F 3/19 |
| 9,614,440 B2* | 4/2017 | Oishi | G05F 1/46 |
| 11,218,122 B2* | 1/2022 | Chang | H03F 3/193 |
| 12,088,263 B2* | 9/2024 | Khlat | H03F 3/24 |
| 2013/0088291 A1* | 4/2013 | Gorisse | H03H 11/0427 |
| | | | 330/75 |
| 2018/0034417 A1* | 2/2018 | Duncan | H02M 3/156 |

OTHER PUBLICATIONS

Kim, J.H. et al., "Analysis and Implementation of Doherty Power Amplifier With Two-Point Envelope Modulation," IEEE Transactions on Microwave Theory and Techniques, vol. 60, No. 5, May 2012, IEEE, pp. 1353-1364.

Extended European Search Report for European Patent Application No. 23154020.4, mailed Jun. 1, 2023, 9 pages.

Wu, P.Y. et al., "A Two-Phase Switching Hybrid Supply Modulator for RF Power Amplifiers With 9% Efficiency Improvement," IEEE Journal of Solid-State Circuits, vol. 45, No. 12, Dec. 2010, IEEE, pp. 2543-2556.

International Search Report and Written Opinion for International Application No. PCT/US2023/062193, mailed May 15, 2023, 13 pages.

\* cited by examiner

VIRTUAL RADIO FREQUENCY (VRF) EQUALIZER FOR ENVELOPE TRACKING INTEGRATED CIRCUIT (ETIC)

PRIORITY CLAIM

The present application claims priority to U.S. Patent Provisional Application Ser. No. 63/304,776 filed on Jan. 31, 2022 and entitled "VRF EQUALIZER," the contents of which is incorporated herein by reference in its entirety.

BACKGROUND

I. Field of the Disclosure

The technology of the disclosure relates generally to envelope tracking integrated circuits (ETICs) and more specifically to an equalizer within an ETIC that reduces ripple for load-modulated power amplifiers.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of new cellular standards such as fifth generation-new radio (5G-NR), there has been increased performance demands placed on power amplifiers used to boost signals for transmission while battery constraints place efficiency requirements on the power amplifiers.

Envelope tracking has been one way in which the power amplifier has been controlled to meet efficiency requirements while also meeting the performance demands. However, envelope tracking for barely Doherty power amplifiers generally requires load modulation, which results in non-linear currents and appurtenant undesirable ripples. Accordingly, there remains room for innovation in envelope tracking for barely Doherty power amplifiers.

SUMMARY

Aspects disclosed in the detailed description include a virtual radio frequency (VRF) equalizer for an envelope tracking integrated circuit (ETIC) and more particularly for an ETIC that provides envelope tracking (ET) for a barely Doherty (BD) power amplifier stage. In a particular, aspect, the VRF equalizer includes circuitry that provides ripple cancelation that is caused by load modulation of the BD power amplifier stage. Additional circuitry is included to compensate for an amplifier within the ETIC. By canceling the ripple within the ETIC, the overall performance and efficiency of the BD power amplifier stage is improved, resulting in better performance of a transmitter in a wireless communication device.

In this regard in one aspect, an ETIC is disclosed. The ETIC comprises a circuit configured to implement a first transform function to cancel ripple induced in a load-modulated power amplifier stage.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a virtual radio frequency (VRF) equalizer for an envelope tracking integrated circuit (ETIC) and more particularly for an ETIC that provides envelope tracking (ET) for a barely Doherty (BD) power amplifier stage. In a particular, aspect, the VRF equalizer includes circuitry that provides ripple cancelation that is caused by load modulation of the BD power amplifier stage. Additional circuitry is included to compensate for an amplifier within the ETIC. By canceling the ripple within the ETIC, the overall performance and efficiency of the BD power amplifier stage is improved, resulting in better performance of a transmitter in a wireless communication device.

Figure 1:
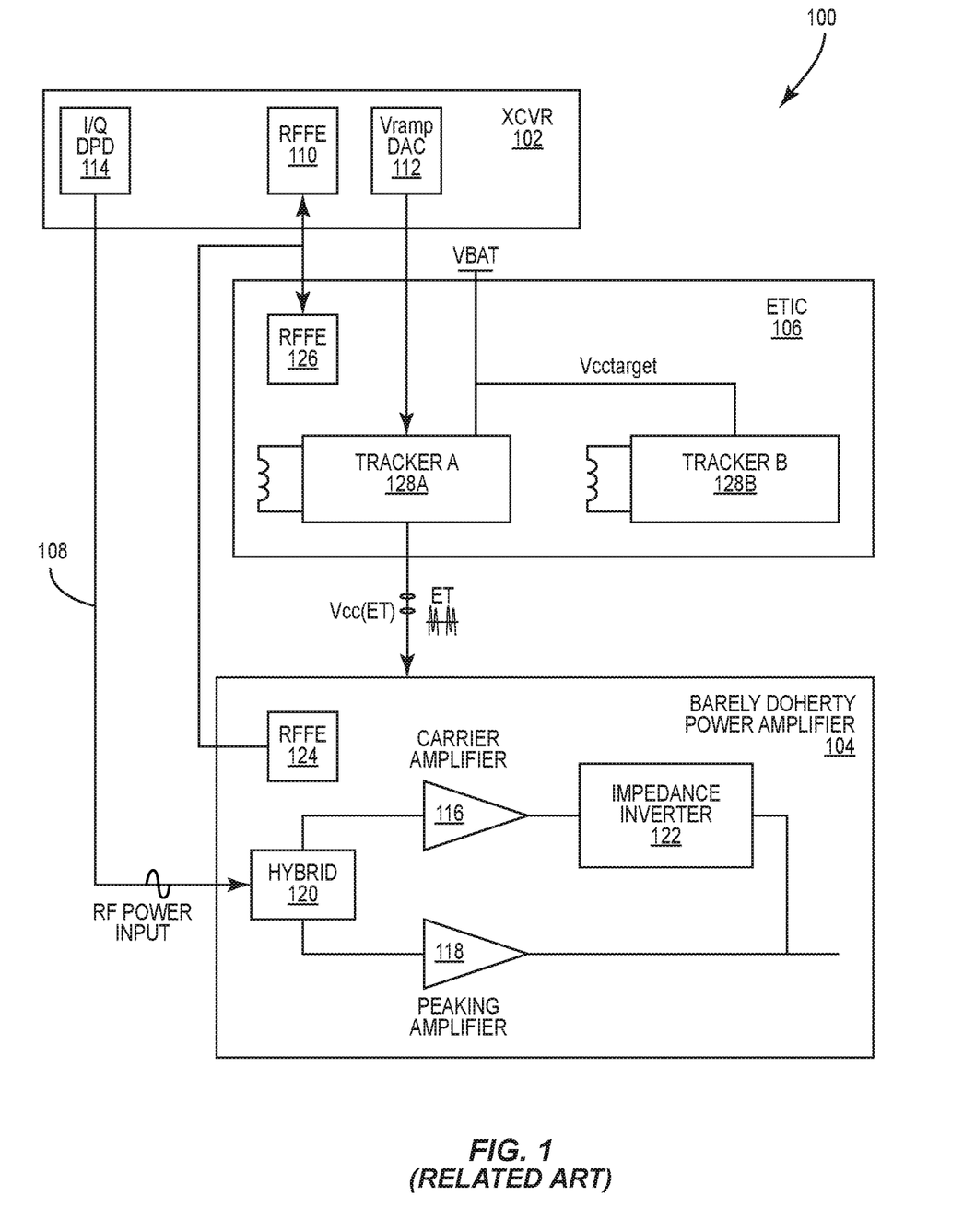
FIG. 1 is a block diagram of a conventional transmission chain having a barely Doherty (BD) power amplifier stage with associated envelope tracking integrated circuit (ETIC)

Before addressing particular aspects of the present disclosure, an overview of a transmission chain having an ETIC and a power amplifier stage is provided with reference to FIG. 1. A discussion of exemplary aspects of the present disclosure begins below with reference to FIG. 2. It should be appreciated that the ripple may be mathematically modeled and an understanding of this mathematical model makes the implementation of the circuit easier. Accordingly, the math is explored with reference to FIG. 2 and specific exemplary circuits are discussed beginning with reference to FIGS. 3 and 4.

In this regard, FIG. 1 is a block diagram of a transmitter or transmission chain 100 that includes a transceiver processor 102 that provides a radio frequency (RF) signal (RF power input) to a power amplifier stage 104. In an exemplary aspect, the power amplifier stage 104 is a Doherty power amplifier that is operated as a barely Doherty (BD) dual envelope ($BD^2E$) power amplifier. The transceiver processor 102 also communicates with an ETIC 106 by providing a Vramp signal to the ETIC 106. The transceiver processor 102, the power amplifier stage 104, and the ETIC 106 may further communicate control signals, commands, and the like through a radio frequency front end (RFFE) bus 108 that complies with the RFFE standard set forth by MIPI.

The transceiver processor 102 may include an RFFE physical layer (PHY) 110 that couples to the RFFE bus 108, a Vramp digital-to-analog converter (DAC) 112 that provides the Vramp signal, and a digital predistortion (DPD) circuit 114 that provides predistortion to the RF signal as is well understood. Additional frequency conversion circuitry and the like may also be present but is not shown.

The power amplifier stage 104 includes a carrier amplifier 116 and a peaking amplifier 118. The power amplifier stage 104 receives the RF signal and provides the RF signal to a hybrid splitter 120, which may create two split signals that are phase shifted relative to one another (e.g., +90 and −90). One signal from the hybrid splitter 120 is provided to the carrier amplifier 116, while the other signal from the hybrid splitter 120 is provided to the peaking amplifier 118. An output of the carrier amplifier 116 may be coupled to an output of the peaking amplifier 118 through an impedance inverter 122. The power amplifier stage 104 may further include an RFFE PHY 124 coupled to the RFFE bus 108. The power amplifier stage 104 receives a voltage control signal Vcc(ET) from the ETIC 106 that modulates the load (i.e., load modulation). Vcc(ET) is compressed by the load modulation. The use of a $BD^2E$ power amplifier in the power amplifier stage 104 allows an increase in the load line seen by the carrier amplifier 116 when the peaking amplifier 118 is disabled. This increase in the load line increases the efficiency of the carrier amplifier 116 and increases the minimum Vcc voltage. Further, this increase in the load line results in the reduction of the voltage swing in envelope tracking when the load modulation is used, resulting in increased ETIC efficiency.

The ETIC 106 may include an RFFE PHY 126 that couples to the RFFE bus 108 as well as two tracker circuits 128A, 128B. The tracker circuits 128A, 128B are coupled to a voltage supply (Vbat) and process the Vramp signal to generate Vcc(ET).

Due to load modulation, the load that the ETIC 106 sees becomes a non-linear function of the modulated RF envelope, and this non-linearity becomes a non-linear function of the supply modulation. The ETIC load current (IccPA) may have different slopes relative to the supply voltage (VccPA) depending on whether the peaking amplifier 118 is active. The modulated current IccPA will induce a voltage ripple on VccPA due to the source impedance presented by the ETIC 104 in series with the trace routing inductance. This ripple may result in unwanted performance variations.

Exemplary aspects of the present disclosure add a VRF circuit to the ETIC to cancel the ripple and improve performance. While there are many ways to model the modulated current IccPA, a model based on the Laplace domain (i.e., achieved by using a Laplace transformation) makes the math much easier to manipulate. Based on the model in the Laplace domain, the poles and zeros of the BD amplifier stage are more readily seen and it is easier to provide compensation based on those modeled poles and zeros.

Figure 2:
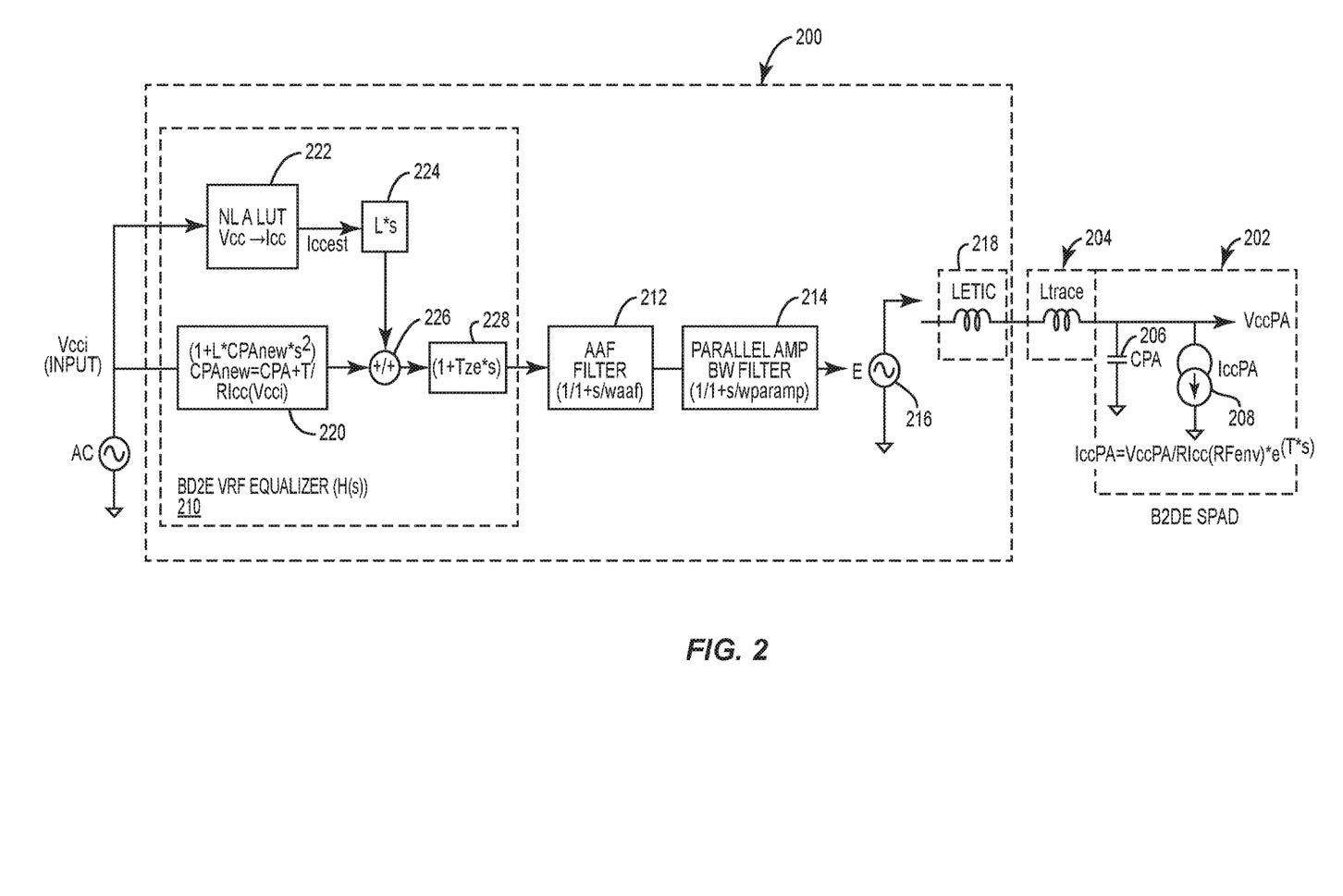
FIG. 2 is a block diagram of an ETIC with a virtual radio frequency (VRF) equalizer that performs ripple cancelation according to exemplary aspects of the present disclosure.

Accordingly, FIG. 2 provides a diagram of elements in an ETIC 200 with the corresponding transfer functions of various elements expressed in the Laplace domain. The ETIC 200 is coupled to a power amplifier stage 202 by trace(s) 204, which may have an inherent inductance Ltrace dictated by the physical geometries (width/length) of the trace 204. The power amplifier stage 202 may be a Doherty power amplifier stage operated as a $BD^2E$ power amplifier stage that has an effective capacitance 206 (also denoted $C_{PA}$). Effectively there is a modulated current source 208 that generates IccPA. IccPA may also be expressed as:

$$IccPA = \frac{VccPA}{RIcc(RFenv)} e^{\tau s}$$

where the resistance RIcc is a function of the RF envelope (RFenv), τ is a delay element described in greater detail below, and s is the Laplace domain element.

The nature of the non-linear current IccPA creates the undesired ripple. Exemplary aspects of the present disclosure cancel the ripple using a VRF equalizer 210. The ETIC 200 also includes an anti-aliasing filter (AAF) 212 and a parallel amplifier 214. Collectively, the ETIC 200 may be modeled as a source 216 with an inductance 218 ($L_{ETIC}$) that provides the signal over the trace 204 to the power amplifier stage 202. The VRF equalizer 210 has a first transform function that is designed to provide a non-linear zero for ripple cancelation and an extra zero to compensate for the pole of the parallel amplifier 214.

Specifically, the AAF 212 may have a Laplace domain function of:

$$\frac{1}{1+\frac{s}{\omega aaf}}$$

where ωaaf is the frequency of the AAF 212. The parallel amplifier 214 may have a Laplace domain function of:

$$\frac{1}{1+\frac{s}{\omega paramp}}$$

where ωparamp is the frequency of the parallel amplifier 214.

Accordingly, the VRF equalizer 210 may include a first transform function 220 to compensate for the capacitance 206. The first function 220 may be expressed as:

$$1+L*CPA_{new}*s^2$$

where:

$$CPA_{new} = CPA + \frac{\tau}{RIcc(Vcci)}$$

The VRF equalizer 210 further includes a look-up table (LUT) 222 which contains entries corresponding to a non-linear analog mapping of the Vcc target (i.e., the signal to be sent to the power amplifier stage 202) to an icc. The output of the LUT 222 (Iccest) is provided to a second transform function 224 which creates an L*s term. A summation circuit 226 sums the output of the first transform function 220 and the second transform function 224. A third transform function 228 is used on the output of the summation circuit 226. The third transform function 228 is:

$$1+\tau ze*s$$

and acts to create an extra zero to compensate for the pole created by the parallel amplifier 214.

Figure 3:
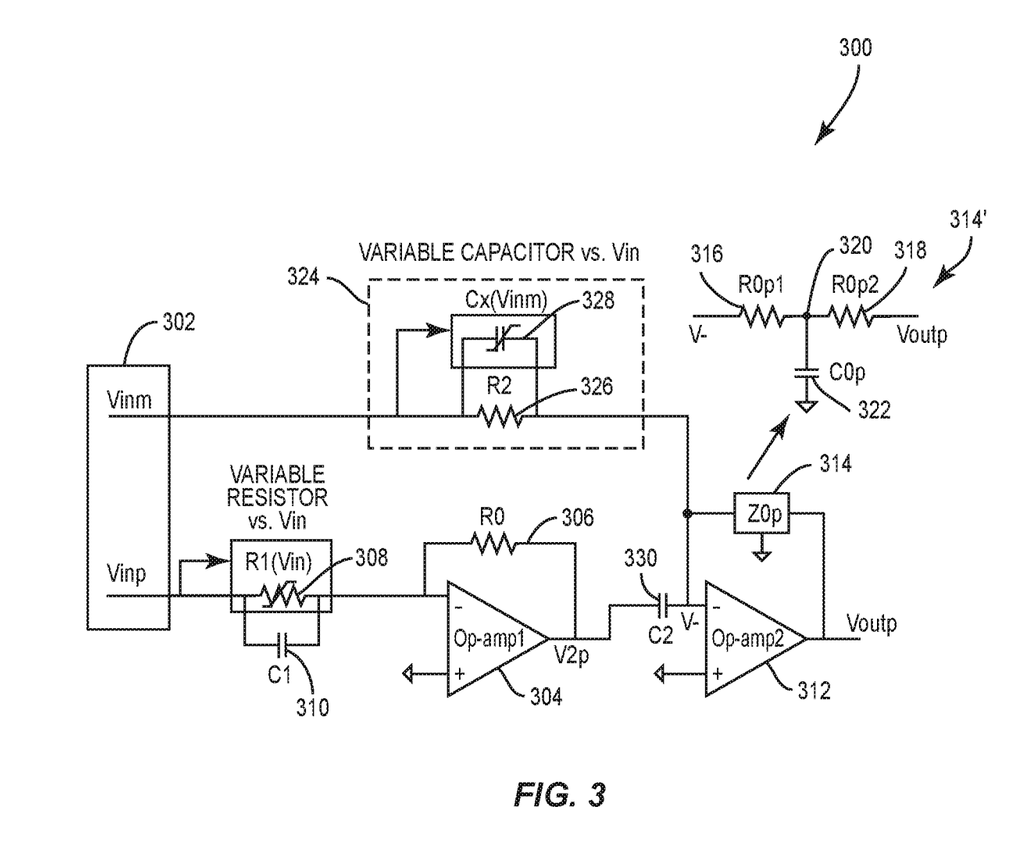
FIG. 3 is a circuit diagram of one possible VRF circuit that uses a variable capacitance for ripple cancelation where a power amplifier capacitance within a power amplifier stage is ignored.

The time constant $$\frac{L}{RIcc}$$

is what sets a zero in the VRF equalizer 210. The present disclosure proposes two structures to create the functions of the VRF equalizer 210 to make R(Icc) non-linear. A first structure, illustrated in FIG. 3, has a single operational amplifier (op-amp) that can create two real zeros, a first real zero made of a T-network feedback circuit that acts as a feedback impedance network and compensates for the dominant pole of the parallel amplifier 214 (i.e., the T-network corresponds to the third transform function 228) and a second zero made of R2*Cx to use for the ripple cancelation (i.e., transform functions 220, 224), where Cx is a variable capacitance that is a function of the modulated target voltage (i.e., Cx(Vin)).

More specifically, and with reference to FIG. 3, a circuit 300 is illustrated. The circuit 300 has a differential input (Vinm, Vinp) 302. However, in practice an op-amp 304 has a large impedance, which effectively creates an open circuit for the Vinp portion. Thus, while the op-amp 304 has a feedback resistor 306 (R0) coupled to an input of the op-amp 304 along with a variable input resistor 308 (R1(Vin)) that is in parallel with an input capacitor 310 (C1), these elements are not active.

The Vinm portion of the input 302 sees an active circuit formed from an op-amp 312. The op-amp 312 includes a feedback impedance network 314, which may, as described above, be a T-network 314' formed from a first resistor 316 (R0p1) in series with a second resistor 318 (R0p2) and having a node 320 therebetween. The node 320 is coupled to a ground through a capacitor 322 (C0p). The input 302 is coupled to the op-amp 312 through a network 324 formed from a resistor 326 (R2) that is electrically parallel to a variable capacitor 328 (Cx(Vinm)).

An output of the op-amp 304 is coupled to an input of the op-amp 312 through a capacitor 330 (C2).

The transform function of the circuit 300 may be expressed as:

$$\frac{Voutp}{Vinp} = \frac{R0p}{R2}*[1+R2*Cx(Vin)*s]*[1+R0p\_par*C0p*s]$$

where R0_par is equivalent to the parallel resistances of the resistors 316 (R0p1), 318 (R0p2). The [1+R2*Cx(Vin)*s] term is the ripple cancelation, and the [1+R0p_par*C0p*s] term is the extra zero for parallel amplifier pole compensation.

Figure 4:
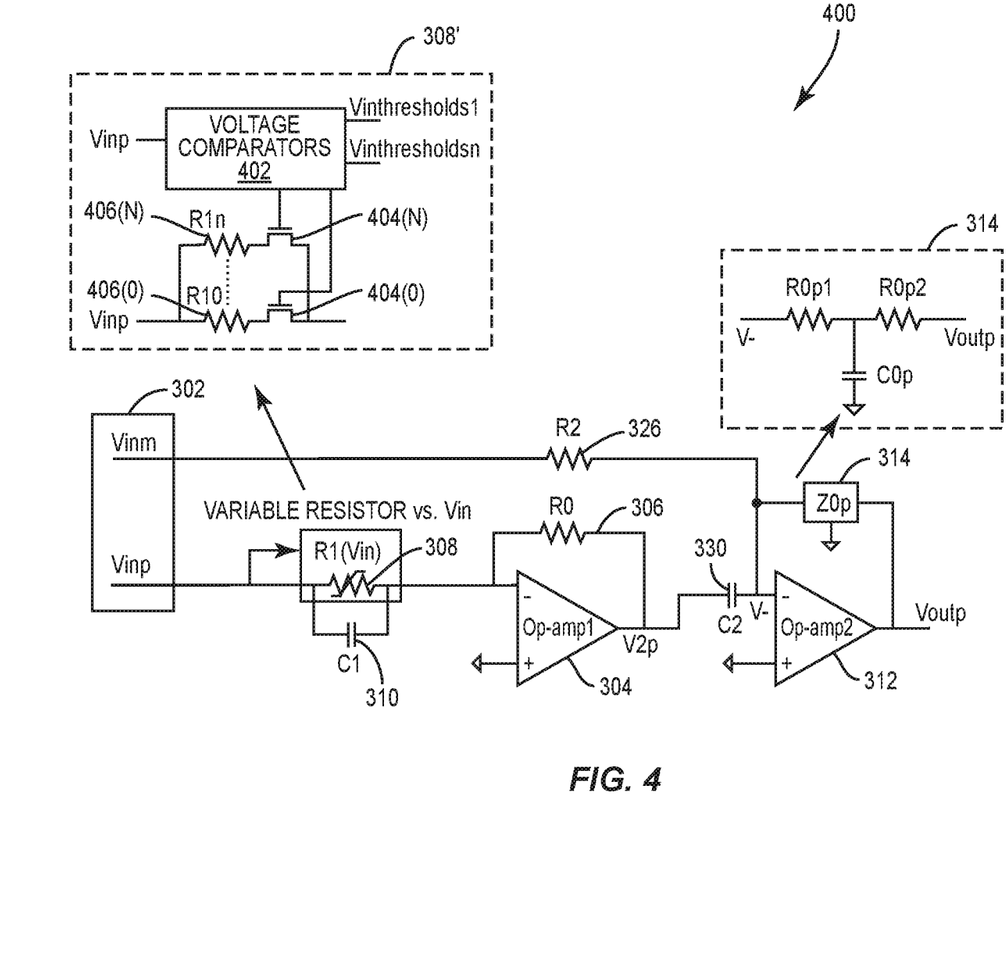
FIG. 4 is a circuit diagram of another possible VRF circuit that uses a variable resistance for ripple cancelation where the power amplifier capacitance is not ignored.

A second structure, illustrated in FIG. 4, has both op-amps operational and active to create a second order equalizer with an added real zero. Further, the coefficient of the second order equalizer $$R2*\frac{R0}{R1(Vin)}$$

is made equal to $$\frac{L}{RIcc(Vcc)}$$

with R1 being a variable resistance as a function of the modulated target voltage. The resistor R1 may be made of multiple parallel values selected via multiple comparators that may compare the target modulated voltage to multiple thresholds to select the RIcc value and thus the R1 resistor.

More specifically, and with reference to FIG. 4, a circuit 400 has many of the same elements as the circuit 300 of FIG. 3 and a repeated discussion of many identical elements is omitted. The variable input resistor 308 is better seen in inset 308', where a comparator bank 402 controls gates 404(0)-404(N) that allow resistors 406(0)-406(N) (R1$_0$-R1$_N$) to be switched in or out of a parallel circuit to set an overall resistance.

The transform function of the circuit 400 may be expressed as:

$$\frac{Voutp}{Vinp} = \frac{R0p}{R2} * \left[1 + R2 * \frac{R0}{R1(Vin)} * C2 * s + R * R0 * C1 * C2 * s^2\right] * [1 + R0p\_par * C0p * s]$$

Figure 5:
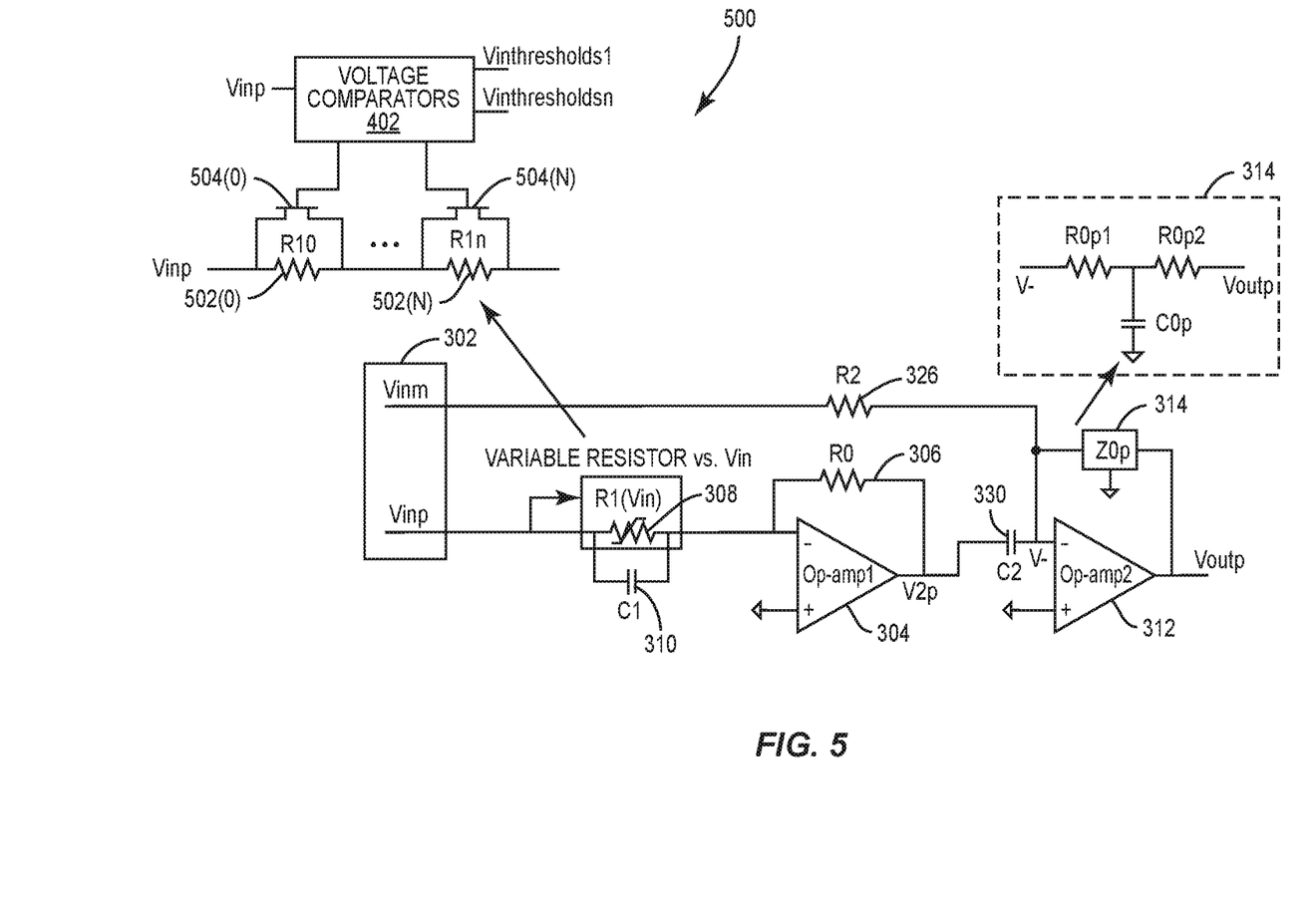
FIG. 5 is a circuit diagram of another possible VRF circuit that uses series resistors to form variable resistance.

Instead of parallel resistors 406(0)-406(N), serial resistors 502(0)-502(N) could be used as better illustrated by circuit 500 in FIG. 5. The comparator bank 402 controls switches 504(0)-504(N) which may selectively bypass the respective resistors 502(0)-502(N).

Figure 6:
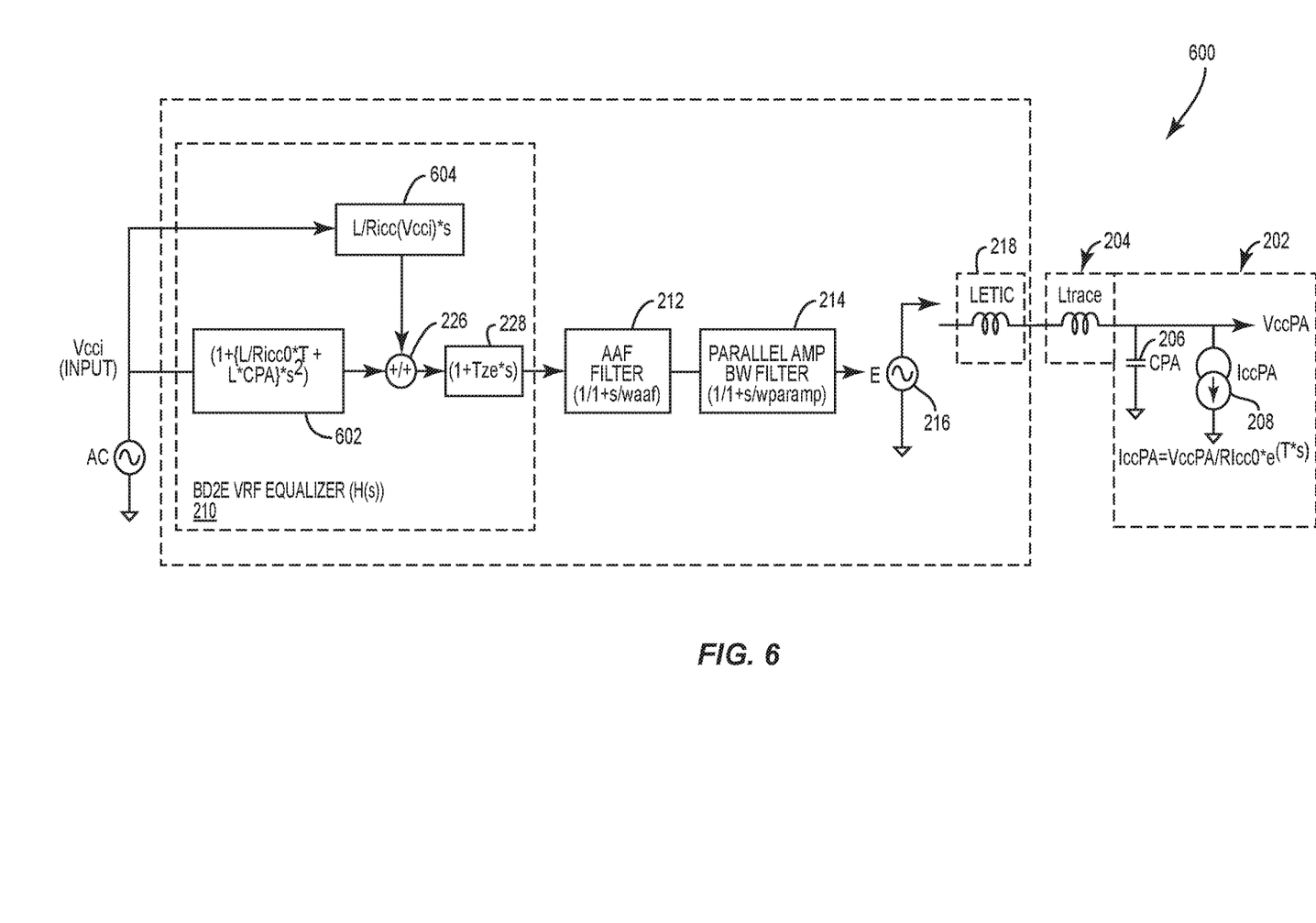
FIG. 6 is a block diagram of a VRF circuit that may accommodate a delay mismatch between current and voltage of the BD power amplifier stage.

The concept of a delay element r has been discussed above. This delay element represents a possible delay mismatch between the current (IccPA) and the voltage (VccPA). While such delay element was present in the extra zero transform function (i.e., the third transform function 228), it is also possible to address the delay element in the first function as better illustrated in FIG. 6. The second order term is modified to:

$$L * CPA + \frac{L\tau}{RIcc0} = L * \left(CPA + \frac{\tau}{RIcc0}\right)$$

Thus, circuit 600 in FIG. 6 may have many elements common to the circuit 200 of FIG. 2, but a first function 602 has been modified to include the new term, and a second function 604 likewise has been modified to avoid reliance on a LUT.

Figure 7:
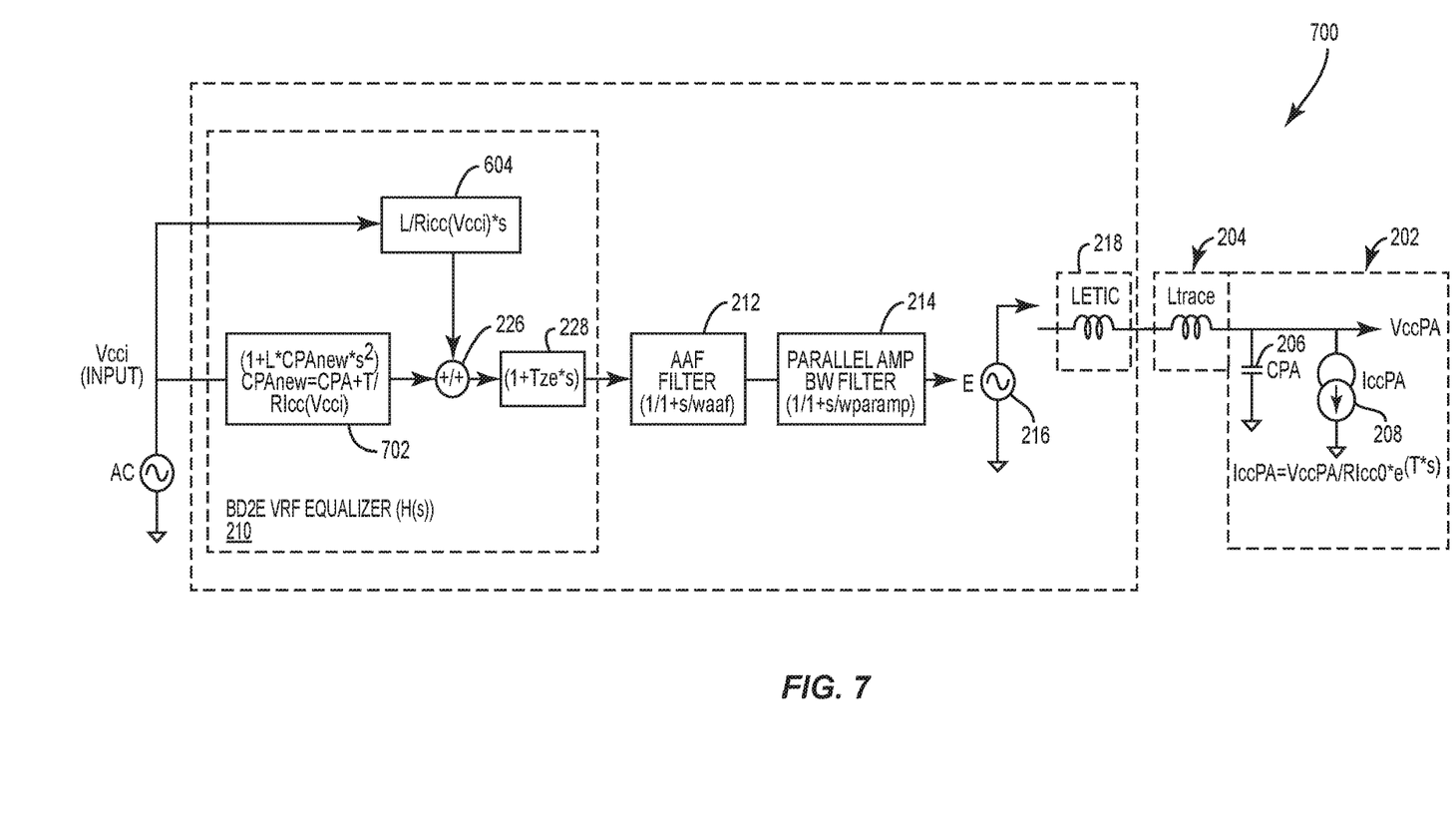
FIG. 7 is a block diagram of a VRF circuit that uses a delay to change equivalent capacitance of the BD power amplifier stage.

A side effect is that the effect of the delay element results in changing of the equivalent CPA capacitance. Specifically, $$CPA_{new} = CPA + \frac{\tau}{RIcc},$$

which can be increased or decreased depending on the delay sign. FIG. 7 illustrates circuit 700 with this option placed into the first transform function 702.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. An envelope tracking integrated circuit (ETIC) comprising:
    a circuit configured to implement a first transform function to cancel ripple induced in a load-modulated power amplifier stage, wherein the circuit is further configured to use a time delay ($\tau$) in calculating a ripple cancelation;
    a parallel amplifier coupled to the circuit; and
    a second circuit configured to compensate for a pole introduced by the parallel amplifier.

2. The ETIC of claim 1, wherein the circuit further comprises a look-up table (LUT) that uses a Vcc target to determine an output current Icc.

3. The ETIC of claim 2, wherein the circuit further comprises a second transform function coupled to the LUT and configured to take a derivative of an output of the LUT using a Laplace transformation.

4. The ETIC of claim 1, wherein the circuit is configured to calculate a new effective capacitance (CPA$_{new}$) for the load-modulated power amplifier stage based on the time delay.

5. An envelope tracking integrated circuit (ETIC) comprising:
    a circuit configured to implement a first transform function to cancel ripple induced in a load-modulated power amplifier stage;
    a parallel amplifier coupled to the circuit; and
    a second circuit configured to compensate for a pole introduced by the parallel amplifier.

6. The ETIC of claim 5, wherein the circuit comprises a first operational amplifier (op-amp).

7. The ETIC of claim 6, wherein the circuit further comprises a second op-amp serially coupled to the first op-amp through a capacitor.

8. The ETIC of claim 6, wherein the circuit further comprises a T-network feedback loop associated with the first op-amp.

9. The ETIC of claim 8, wherein the T-network feedback loop comprises a first resistor serially coupled to a second resistor with a node therebetween, wherein the node is coupled to ground through a capacitor.

10. The ETIC of claim 6, wherein the circuit further comprises an input coupled to the first op-amp through a variable capacitor.

11. The ETIC of claim 10, wherein the circuit further comprises a resistor coupled electrically to the variable capacitor and electrically parallel thereto.

12. The ETIC of claim 6, wherein the circuit further comprises an input coupled to the first op-amp through a variable resistor.

13. The ETIC of claim 12, wherein the circuit further comprises a capacitor coupled electrically to the variable resistor and electrically parallel thereto.

14. The ETIC of claim 1, further comprising an anti-aliasing filter (AAF) coupled to the circuit and the parallel amplifier and positioned between the circuit and the parallel amplifier.

15. The ETIC of claim 6, further comprising:
    a T-network feedback loop associated with the first op-amp; and
    wherein the circuit further comprises a second op-amp serially coupled to the first op-amp through a capacitor.

16. The ETIC of claim 10, wherein the variable capacitor is configured to vary capacitance as a function of a non-linear input voltage.

17. The ETIC of claim 12, wherein the variable resistor is configured to vary resistance as a function of a non-linear input voltage.

* * * * *